United States Patent
Le et al.

(10) Patent No.: US 8,738,819 B2
(45) Date of Patent: *May 27, 2014

(54) MEMORY-MODULE EXTENDER CARD FOR VISUALLY DECODING ADDRESSES FROM DIAGNOSTIC PROGRAMS AND IGNORING OPERATING SYSTEM ACCESSES

(71) Applicants: Jerry N. Le, Irvine, CA (US); Ngoc V. Le, Irvine, CA (US); Tat Leung Lai, Torrance, CA (US); Ramon S. Co, Trabuco Canyon, CA (US)

(72) Inventors: Jerry N. Le, Irvine, CA (US); Ngoc V. Le, Irvine, CA (US); Tat Leung Lai, Torrance, CA (US); Ramon S. Co, Trabuco Canyon, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/760,948

(22) Filed: Feb. 6, 2013

(65) Prior Publication Data

US 2013/0151904 A1   Jun. 13, 2013

Related U.S. Application Data

(63) Continuation of application No. 12/965,699, filed on Dec. 10, 2010, now Pat. No. 8,396,998.

(51) Int. Cl.
*G06F 3/00* (2006.01)

(52) U.S. Cl.
USPC .................................. 710/15; 710/2; 710/17

(58) Field of Classification Search
None
See application file for complete search history.

(56) References Cited

U.S. PATENT DOCUMENTS

| 5,467,314 | A | * | 11/1995 | Miyazawa et al. | ............ | 365/201 |
| 6,055,653 | A | * | 4/2000 | LeBlanc et al. | ............... | 714/718 |
| 2006/0123444 | A1 | * | 6/2006 | Schaffer et al. | ................. | 725/33 |

* cited by examiner

*Primary Examiner* — Zachary K Huson
(74) *Attorney, Agent, or Firm* — Stuart T. Auvinen; gPatent LLC

(57) ABSTRACT

A diagnostic extender card is plugged into a memory module socket on a personal computer (PC) motherboard. The extender card has a test socket that receives a memory module and an intercepting decoder chip that receives the chip-select (CS) from the motherboard that selects the memory module for access. When CS is activated, the intercepting decoder chip illuminates a visual indicator on the extender card, allowing a user to locate a memory module being accessed. The exact translation or mapping from logical addresses of test programs to physical addresses of the memory modules is not needed, since the visual indicator shows which memory module is really being accessed, regardless of proprietary address mapping by north bridge chips. Operating system memory accesses are filtered out by a counter that counts accesses during a period set by a timer. When the number of accesses exceeds a threshold, the visual indicator is lit.

19 Claims, 7 Drawing Sheets

MEMORY-MODULE EXTENDER CARD FOR VISUALLY DECODING ADDRESSES FROM DIAGNOSTIC PROGRAMS AND IGNORING OPERATING SYSTEM ACCESSES

FIELD OF THE INVENTION

This invention relates to extender cards, and more particularly to memory module extender cards with visual indicators for debugging.

BACKGROUND OF THE INVENTION

Many computer systems such as personal computers (PCs) use memory modules as their main memory. Memory modules may be tested using PC-motherboard-based testers. Servers may use many memory modules.

When a memory modules fails on a server, it can be difficult to determine which of the many memory modules has failed. A software tool such as a memory diagnostics program can be executed on the server to write and read locations in the memory. However, these memory diagnostic programs access virtual or logical addresses, rather than the physical addresses of the memory modules.

The operating system (OS) running on the server (in conjunction with BIOS) may remap logical addresses while the processor and chips such as a north bridge chip translate logical addresses from the processor to physical addresses. While the address translation is deterministic, it may not be known to the end user, since manufacturers often keep address translation as a trade secret.

When a memory diagnostics program is executed on a processor or Central Processing Unit (CPU), a sequence of logical addresses are written and read back. Mismatched data read back indicates a faulty memory location within the logical address space. Since the mapping from the logical address space to the physical address space and the memory modules is not known to the user, it cannot be readily determined which memory module is malfunctioning despite the memory diagnostic program having located the error by its logical address. A technician cannot easily determine which of the many memory modules to replace despite running the memory diagnostic program and may have to replace memory modules one by one until the problem is fixed.

What is desired is a diagnostic method that can identify which memory module is malfunctioning. An extender card with a visual indicator is desired to show which memory module is malfunctioning when a memory diagnostic program is executed.

DETAILED DESCRIPTION

The present invention relates to an improvement in memory module diagnostics. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
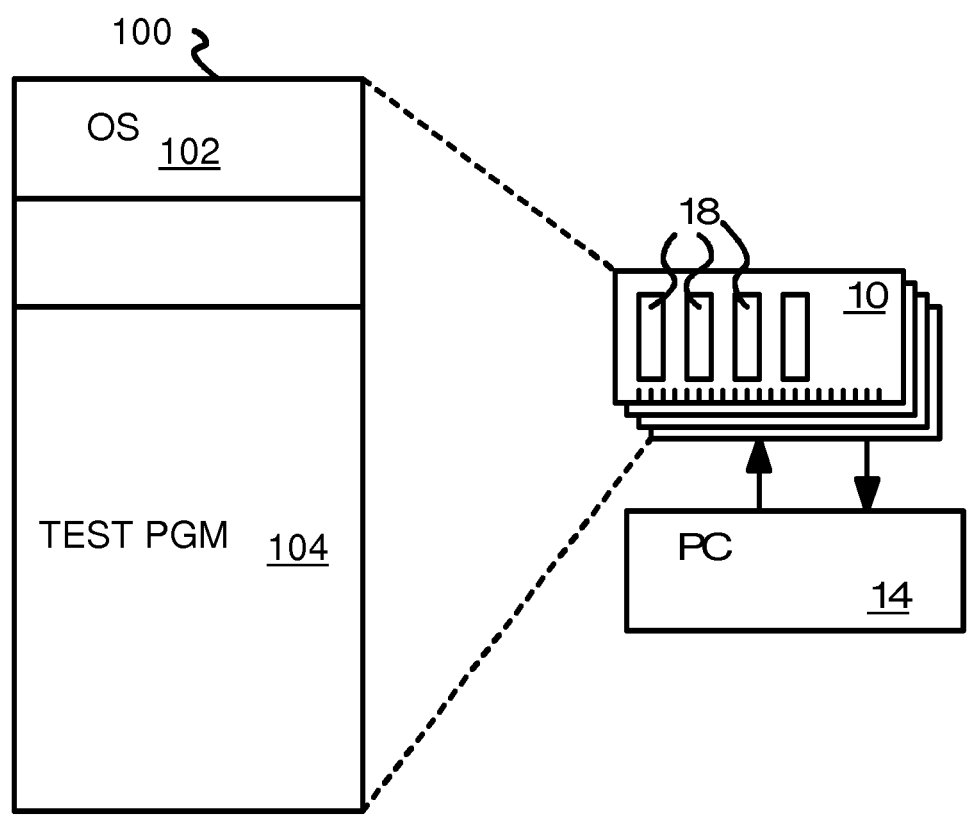
FIG. 1 is a diagram highlighting a test program accessing memory modules on a PC.

FIG. 1 is a diagram highlighting a test program accessing memory modules on a PC. Logical memory space 100 includes test program 104 which accesses logical memory locations in the lower portion of logical address space 100, and operating system 102 which accesses logical memory locations in the higher portion of logical address space 100. PC 14 includes a processor that reads logical address space 100 that is physically stored in memory chips 18 on memory modules 10. PC 14 executes instructions from test program 104 and also executes instructions from operating system 102.

Since operating system 102 controls the execution of test program 104, when test program 104 is running, some instructions from operating system 102 may be executed at nearly the same time. For example, operating system 102 may allow test program 104 to execute, but then may pause test program 104 so that operating system 102 may execute a few instructions to update a clock or a timer, or to check the status of other programs. Then operating system 102 allows test program 104 to resume execution. Thus some instructions from operating system 102 can be executed when test program 104 is running.

This makes diagnostics difficult, because test program 104 could be set to loop on a particular memory address that is failing, but some other memory addresses are accessed during this loop when operating system 102 performs some background operation. Thus the wrong logical memory address and ultimately the wrong memory module could be pointed to by OS accesses during the test program loop.

Figure 2A:
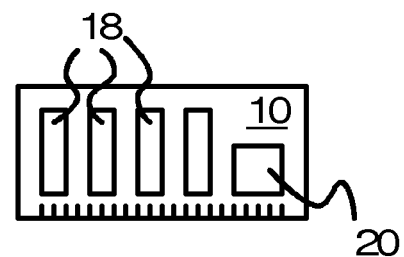
FIGS. 2A-B show an extender card with a visual address decoder between a PC motherboard and a memory module.
Figure 2B:
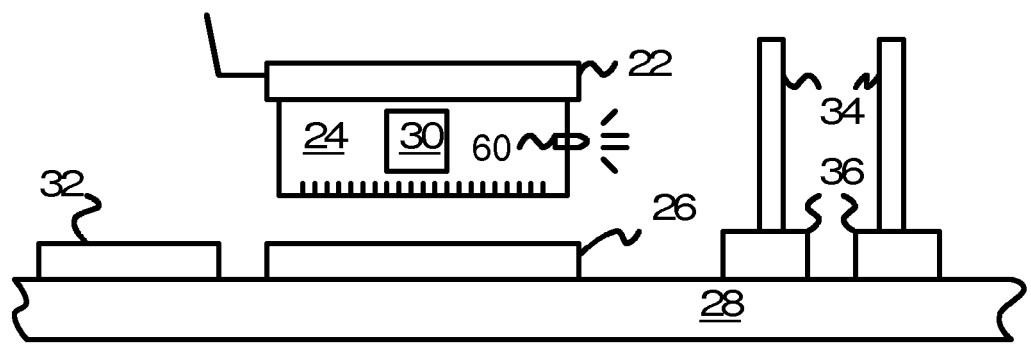

FIGS. 2A-B show an extender card with a visual address decoder between a PC motherboard and a memory module. In FIG. 2A, memory module 10 contains DRAM chips 18 and buffer chip 20. Buffer chip 20 may contain buffers or programming information for decoding or organizing DRAM chips 18 into ranks or banks of memory. Buffer chip 20 is not present on all types of memory modules 10.

Extender card 24 is a printed-circuit board (PCB) or other substrate that has test socket 22 mounted on its upper edge, and has metal fingers or contact pads along its bottom edge. Metal wiring traces on extender card 24 connect corresponding signals on the lower-edge contact pads to metal pads in test socket 22, thus passing signals through. However, some signals are also routed to intercepting decoder chip 30 on extender card 24. This routing allows intercepting decoder chip 30 to observe or sniff address and chip-select signal sent from PC motherboard 28 to memory module 10.

When intercepting decoder chip 30 detects that DRAM chips 18 on memory module 10 inserted into test socket 22 are being accessed, such as by detecting that PC motherboard 28 has activated the chip select signal to memory module socket 26, intercepting decoder chip 30 energizes visual indicator 60 on extender card 24. The light from visual indicator 60 is visible to a user, indicating that memory module 10 is being accessed.

PC motherboard 28 is a larger PCB that has chips, sockets, and other components mounted thereon, such as chip 32 and expansion sockets 36 which have expansion cards 34 plugged in. Expansion cards 34 can be Peripheral Component Interconnect (PCI), Peripheral Components Interconnect Express (PCIE), AT-bus, or other expansion cards. Chip 32 can be the main microprocessor, chip set, cache memory, or other chips.

Memory module socket 26 is one of several sockets designed to fit memory module 10 or other memory modules. Memory module socket 26 is mounted to the PCB substrate of PC motherboard 28, and fits the contact pads on the bottom side of extender card 24, or the contact pads on memory module 10.

FIG. 2B shows the extender card with the intercepting decoder chip plugged into the PC motherboard. The contact pads on memory module 10 fit into test socket 22 on extender card 24. Test socket 22 may be a zero-insertion force test socket while memory module socket 26 on PC motherboard 28 may be an inexpensive socket. Test socket 22 can also be a conventional memory module socket similar to memory module socket 26. The contact pads on the bottom edge of extender card 24 fit into memory module socket 26 on PC motherboard 28. Electrical contact is made by sockets 22, 26, with wiring traces on extender card 24 passing most signals through from PC motherboard 28 to memory module 10.

Figure 3:
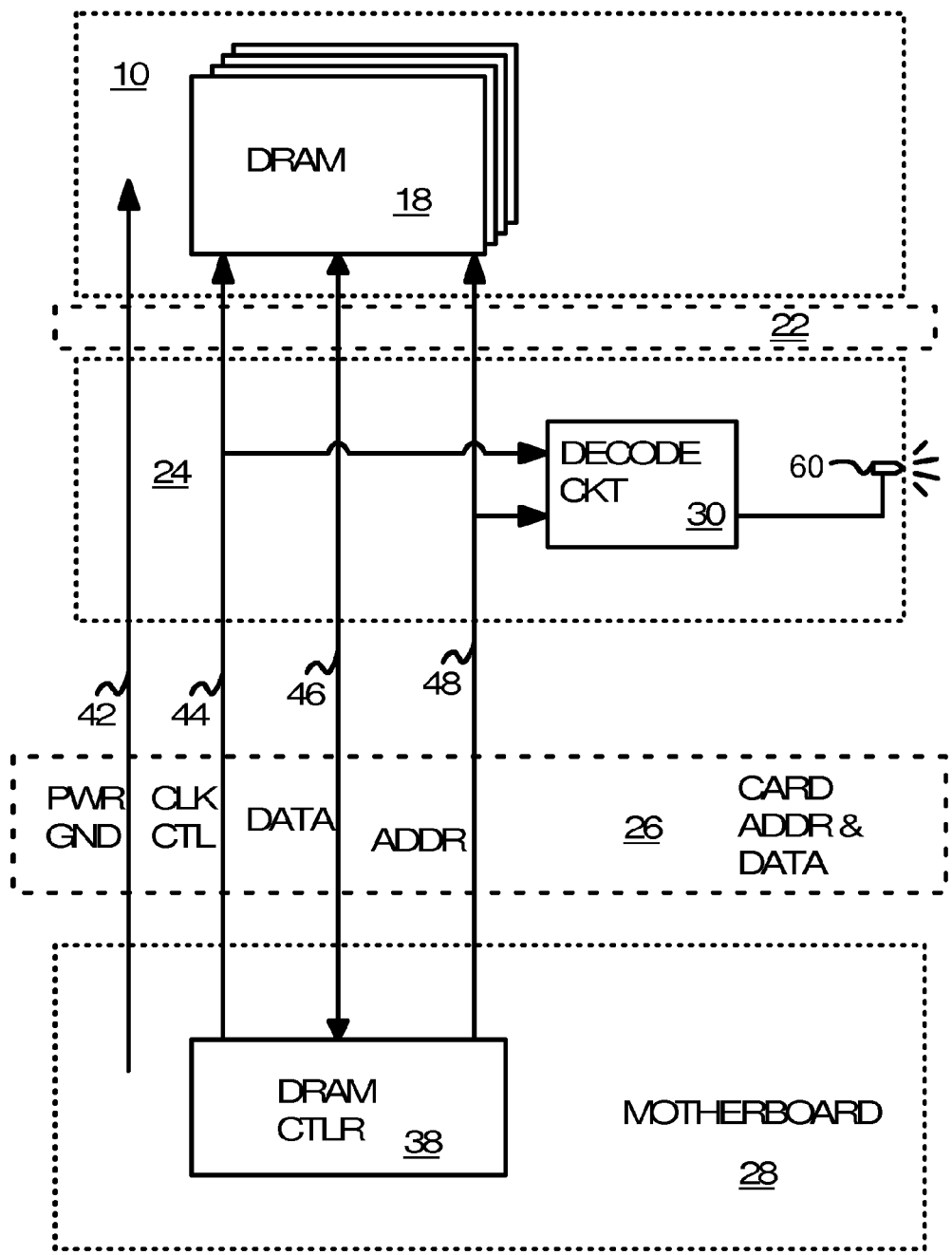
FIG. 3 is a wiring diagram showing connection of signals through the extender card to the memory module and interception of an address by the intercepting decoder chip.

FIG. 3 is a wiring diagram showing connection of signals through the extender card to the memory module and interception of an address by the intercepting decoder chip. Power and ground lines 42 from PC motherboard 28 are routed through contacts on memory module socket 26 and wiring traces on extender card 24 to contacts on test socket 22 to power DRAM chips 18 on memory module 10. Intercepting decoder chip 20 on extender card 24 is also powered by power and ground lines 42.

Address signals 48, data signals 46, and control signals 44 from DRAM controller 38 on PC motherboard 28 are passed through extender card 24 and sockets 22, 26 to reach DRAM chips 18 on memory module 10. When DRAM chips 18 are synchronous DRAMs, control signals 44 can include a clock signal or strobes.

Intercepting decoder chip 30 examines the chip select signal from control signals 44 and activates visual indicator 60 when the chip select signal is active. DRAM controller 38 decodes the address from the CPU on motherboard 28, such as a logical address, and determines which of the possible many memory modules to activate. A different chip select may be generated for each memory module, or additional decoding may be performed. When the chip select line to memory module socket 26 is activated, memory module 10 is typically accessed while other memory modules in other sockets are not accessed.

Intercepting decoder chip 30 can latch or extend the pulse width of the chip select signal so that visual indicator 60 remains on for longer than the duration of the access. For example, a trigger circuit could latch the chip select signal using a clock, then keep the drive signal to visual indicator 60 active for some number of clocks, such as 10 clocks.

Intercepting decoder chip 30 may decode some of the address signal 48 before activating visual indicator 60. Intercepting decoder chip 30 may also latch in the address, or a part of the address, and display this latched address as a hexadecimal number on a liquid crystal display (LCD) on extender card 24 (not shown).

Figure 4A:
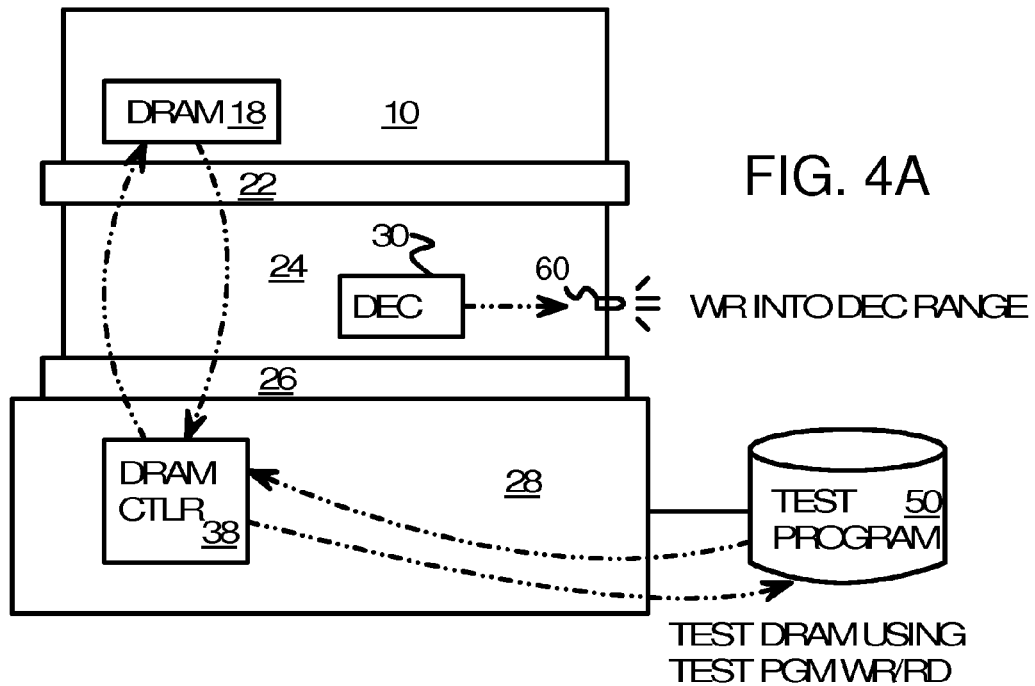
FIG. 4A highlights a PC motherboard testing a memory module using an intercepting decoder chip on an extender card.

FIG. 4A highlights a PC motherboard testing a memory module using an intercepting decoder chip on an extender card. Extender card 24 is plugged into socket 26 on PC motherboard 28. Memory module 10 is inserted into test socket 22 on extender card 24, allowing PC motherboard 28 to perform memory testing, such as by executing test program 50.

Test program 50 has instructions to write and read back many logical address locations. When these instructions are executed on the CPU on motherboard 28, logical addresses are sent to DRAM controller 38, which re-maps these logical addresses into physical addresses that include address signals 48 and control signals 44 (FIG. 3), which may include a chip select signal.

When DRAM controller 38 reads or writes to a physical address in memory module 10, it activates the chip select (CS) to memory module socket 26. Intercepting decoder chip 30 responds to the chip select signal by activating or illuminating visual indicator 60.

DRAM controller 38 can be configured for the memory size, type, and timing of memory module 10. Addresses from the microprocessor can be routed to different row and column address lines to DRAM chips 18 for different memory sizes. The number of clock cycles between control signals sent from DRAM controller 38 to DRAM chips 18 can be adjusted to meet the timing parameters in the configuration. BIOS can verify the configuration by writing and reading back data from locations in the configured memory of DRAM chips 18.

More extensive test programs 50 can be executed that write and read each location in DRAM chips 18 using a variety of test patterns such as walking ones and zeros, checkerboard, etc. These test patterns are executed on the microprocessor on PC motherboard 28 from test program 50, although some test programs may also exist in the BIOS.

Since extender card 24 passes through signals from DRAM controller 38 to DRAM chips 18, DRAM chips 18 can be tested as if memory module 10 was plugged directly into socket 26 on PC motherboard 28.

Should testing of DRAM chips 18 reveal a fault, test program 50 can be set to continuously or repeatedly loop through the faulty memory location, writing and reading the bad logical address. When there are many memory modules and sockets on PC motherboard 28, each with an extender card 24, the extender card 24 with its visual indicator 60 illuminated has the memory module 10 with the bad memory location. Thus the memory module having the physical address that maps to the logical address being looped to in test program 50 is identified by illumination of visual indicator 60 on extender card 24 that the faulty memory module 10 is plugged into.

Figure 4B:
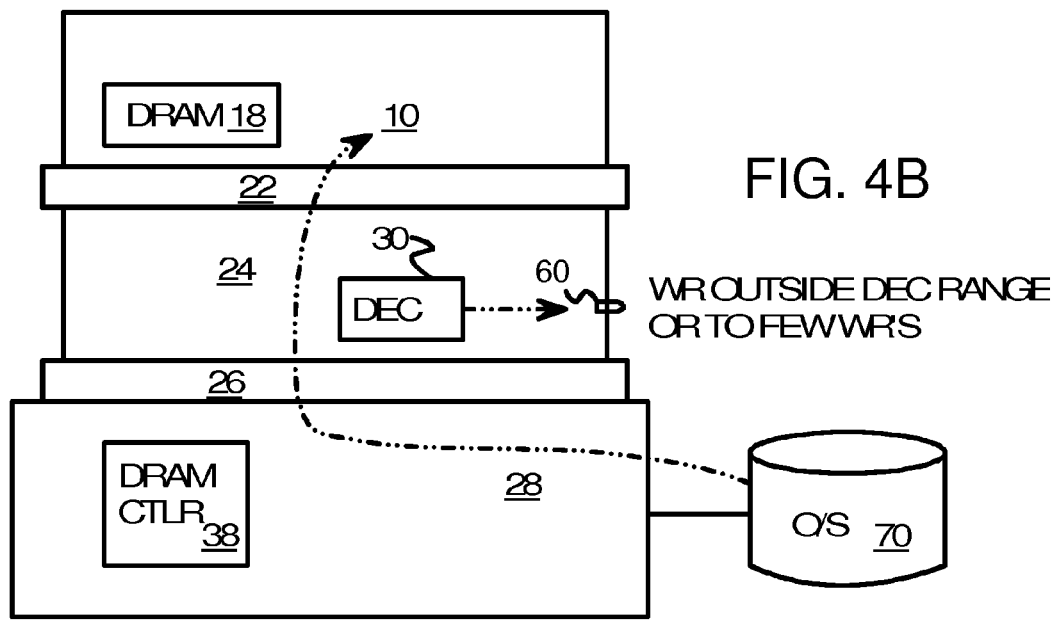
FIG. 4B highlights a PC motherboard writing outside the physical address range of an intercepting decoder chip for a memory module socket.

FIG. 4B highlights a PC motherboard writing outside the physical address range of an intercepting decoder chip for a memory module socket. When the logical addresses being accessed by test program 50 do not map to physical addresses inside memory module 10, DRAM controller 38 does not activate the chip select to memory module socket 26. Instead, the chip select to a different memory module socket 26 (not shown) is activated. Intercepting decoder chip 30 does not activate visual indicator 60 since the chip select to memory module socket 26 was not activated. Visual indicator 60 remains dark.

Figure 5:
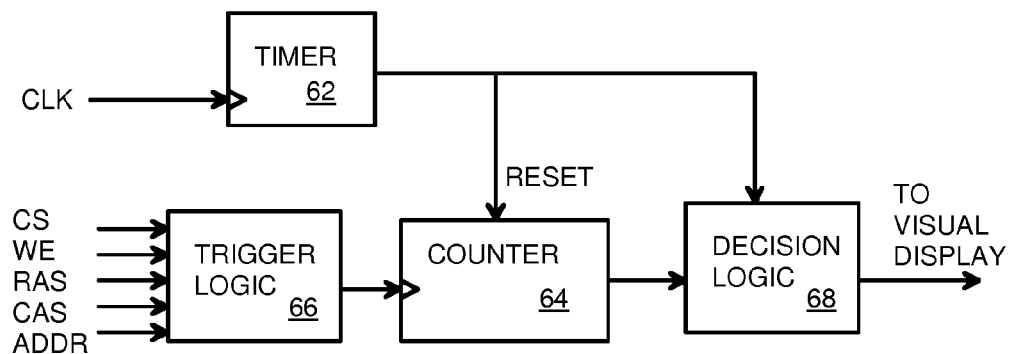
FIG. 5 shows a schematic of an intercepting decoder chip that filters out spurious operating system accesses.

FIG. 5 shows a schematic of an intercepting decoder chip that filters out spurious operating system accesses. When test program 50 of FIG. 4 is executing, the operating system may still execute some instructions, accessing other memory locations that are not being accessed by test program 50. When test program 50 is looping on a faulty memory address, these memory accesses by the operating system are undesirable, since they can make the wrong memory module appear to be the target of test program 50. Visual indicator 60 for a memory module containing addresses accessed by the operating system could be activated by these operating system memory accesses. The user could assume that these memory modules with visual indicator 60 activated are being accessed by test program 50, when in reality those memory modules are being accessed by the operating system.

The inventors realize that the majority of the memory accesses should be from test program 50 while a smaller minority of accesses are from the operating system. The inventors have devised a filtering circuit that filters out the fewer accesses that are presumed to be caused by the operating system, allowing the greater number of accesses due to test program 50 to activate visual indicator 60.

A minimum threshold or accesses can be set. The number of accesses per time period by the operating system should fall below this minimum threshold, while the number of accesses per time period by test program 50 should be above this minimum threshold.

Timer 62 is clocked by the clock from DRAM controller 38 to memory module 10 that is in control signals 44 (FIG. 3). Timer 62 periodically generates a reset signal that resets counter 64. Thus the time period is set by timer 62.

Counter 64 is triggered to increment when a valid memory access occurs to the memory module inserted into test socket 22 on extender card 24 containing this intercepting decoder chip 30. For example, when RAS or CAS is activated and the chip select CS is also activated, counter 64 is triggered and increments its count value. The address may also be decoded to generate the trigger, or the trigger may be qualified to only trigger on a write when WE is active. The trigger could also be qualified by RAS, and other latching logic could latch in the row address from address signals 48 (FIG. 3), or it could be qualified by CAS, with the column address being latched in. A hexadecimal or digital display on extender card 24 could then display the row or column address to the user. This digital display could be separate from visual indicator 60 or could act as visual indicator 60.

The count value from counter 64 is compared to a minimum threshold by decision logic 68. When the count value from counter 64 exceeds the minimum threshold, decision logic 68 drives an activation signal to visual indicator 60, causing 60 to be illuminated.

Figure 6:
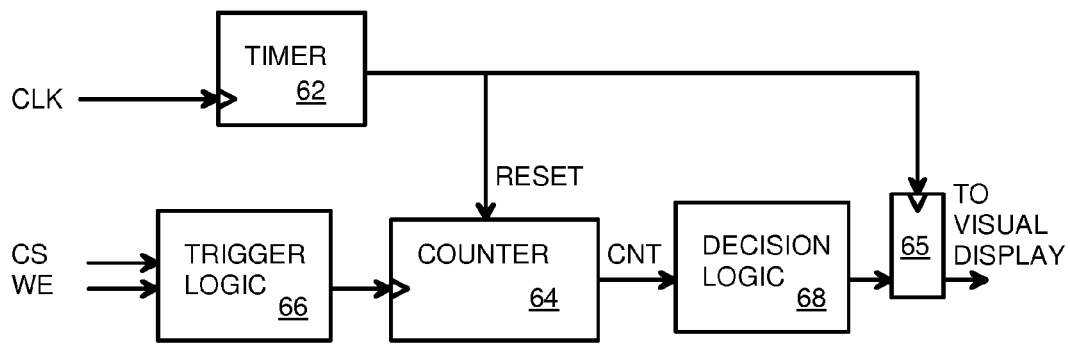
FIG. 6 shows a schematic of an intercepting decoder chip that filters out spurious operating system accesses using chip select.

FIG. 6 shows a schematic of an intercepting decoder chip that filters out spurious operating system accesses using chip select. Intercepting decoder chip 30 with timer 62, counter 64, and decision logic 68 operate as described above. However, trigger logic 66 triggers counter 64 to increment when chip select is activated (trigger on reads and writes), or when both the chip select and the write enables are active (trigger only on writes). Latch 65 latches the output of decision logic 68 so that visual indicator 60 can be driven for a longer period of time, increasing the apparent brightness of illumination. Latch 65 is a flip-flop that is reset by the reset signal from timer 62. For example, latch 65 could be a D-type flip-flop with its clock driven by the output from decision logic 68 and its D-input tied high, or it could be a flip-flop clocked by a clock from timer 62 and receiving the output from decision logic 68 at its D-input.

Figure 2B:
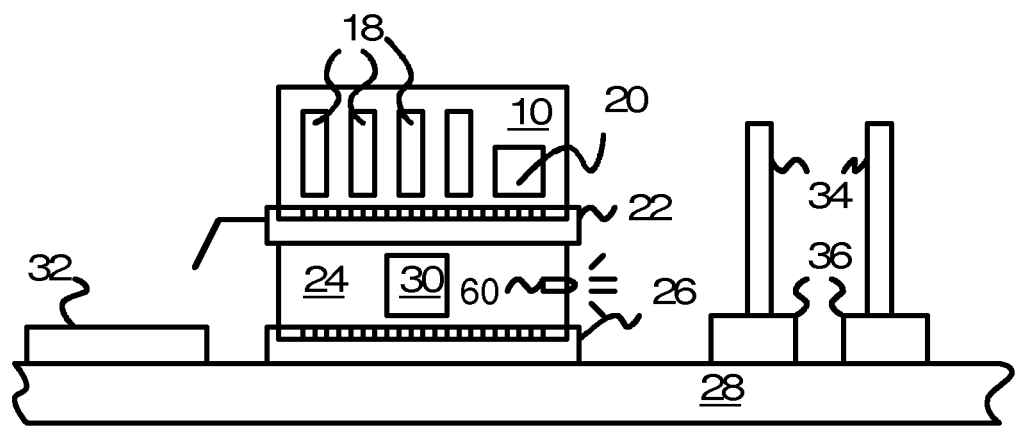
Figure 7:
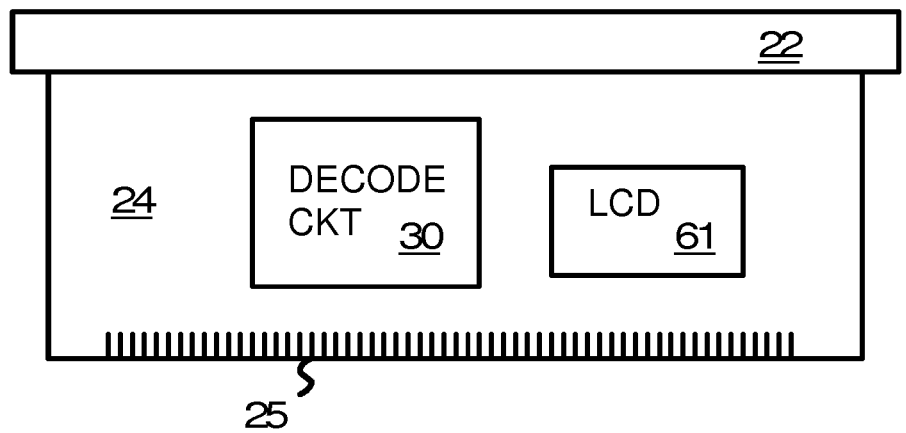
FIG. 7 shows a variation of the diagnostic extender card with a digital display driven by the intercepting decoder chip.

FIG. 7 shows a variation of the diagnostic extender card with a digital display driven by the intercepting decoder chip. Extender card 24 has metal wiring traces between metal contact pads 25 that fit into memory module socket 26 on PC motherboard 28 (FIG. 2) and test socket 22 that receives memory module 10. Intercepting decoder chip 30 examines the chip select signal and optionally other signals such as the clock, RAS, CAS, and address signals between contact pads 25 and test socket 22. The address signals contain the row address when RAS is driven active (low), and the column address when CAS is driven active (low). The row and/or column address is latched in and driven onto LCD 61 so that the user can see the row or column address that was captured. This allows the user to map the logical address from test program 50 to the physical address within the memory module.

Intercepting decoder chip 30 could be programmable so that the test program or another diagnostic program could determine whether the row or the column address is displayed on LCD 61. LCD 61 can be a small liquid crystal display (LCD), or could be some other kind of display. Additional display driver chips could be present, or could be part of a component module for LCD 61. The display driver logic could also be integrated into intercepting decoder chip 30.

Figure 8:
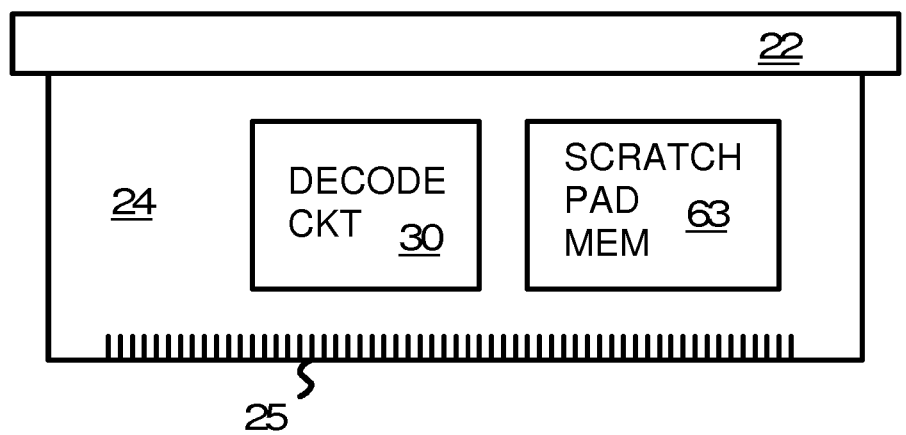
FIG. 8 shows a variation of the diagnostic extender card with a scratch pad memory driven by the intercepting decoder chip.

FIG. 8 shows a variation of the diagnostic extender card with a scratch pad memory driven by the intercepting decoder chip. Scratch pad memory 63 is controlled by intercepting decoder chip 30. Rather than send the row or column addresses to a digital display, the row and column address may be stored in scratch pad memory 63. A diagnostic program may read scratch pad memory 63 by sending a special sequence of addresses and data, or by reading an I/O address. Memory module 10 could be removed from extender card 24 to allow scratch pad memory 63 to be read after the addresses are captured. Other diagnostic data may be saved in scratch pad memory 63, such as a log of recent memory accesses, or statistics of accesses.

Figure 9:
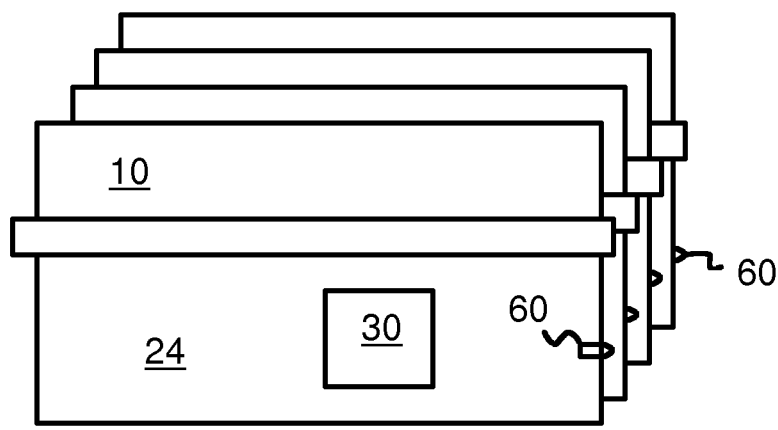
FIG. 9 shows a stack of memory modules and extender cards with the visual indicator on the edges.

FIG. 9 shows a stack of memory modules and extender cards with the visual indicator on the edges. PC motherboard 28 may have several memory module sockets 26, such as four, eight, or more for servers. Memory module sockets 26 may be placed close together, causing visual indicator 60 on some extender cards 24 in the middle of the stack to be blocked by extender card 24 on the top of the stack. Visual indicator 60 may be placed on the side edge of extender card 24 so that visual indicators 60 are visible for many extender cards 24 in a stack. Thus the user can quickly see which memory module is failing.

A technician could turn off a faulty server, remove all the memory modules, then insert an extender card 24 into each memory module socket 26, then plug memory modules 10 into test sockets 22 in each of the extender cards 24. The server can be rebooted and test program 50 executed. When a failing address is located by test program 50, then test program 50 can jump to a looping routine that continuously writes and reads just the one faulty memory location. Visual indicator 60 lights up for the memory module being accessed by that faulty memory location, since most accesses are to the physical address corresponding to the logical address being accessed by test program 50. Operating system accesses may occur, but these can be filtered out so that they do not illuminate visual indicator 60, such as by using the logic of FIG. 6.

The technician can then remove the memory module plugged into extender card 24 with the illuminated visual indicator 60 and insert a new memory module into extender card 24. The test program can be re-run, this time finding no faults. The server can then be restored to server once the technician removes all of the extender cards 24 and replaced the good memory modules into memory module sockets 26. Alternately, the technician could leave extender cards 24 in the server for use at a later time.

Alternate Embodiments

Several other embodiments are contemplated by the inventors. For example visual indicator 60 could be a light-emitting diode (LED), a liquid crystal display (LCD), or some other visual indicators. Visual indicator 60 could change colors when triggered, or could flash or display continuously. Other forms of an output indication such as audio or a log file that is transmitted over a computer network could be substituted for visual indicator 60.

Some memory modules may contain multiple banks or ranks. Additional chip select signals can be provided by the motherboard to access the different ranks in a memory module. The chip selects may be encoded with the rank information. Intercepting decoder chip 30 can receive several CS signals and perform additional detection of the different ranks of the inserted memory module.

The memory module or extender card 24 may contain additional components, such as passive capacitors and resistors, and active components such as buffer chips, and registers for buffering control, address, or data lines.

The PC motherboard can be a standard motherboard, or can be a modified board, such as one having the socket for the extender card reverse-mounted on the solder side rather than the component side of the motherboard substrate. The PC motherboard can be one of several in a larger test system, such as in a robotic test system. A handler can automatically insert and remove the memory modules being tested, or a robotic arm or human operator can handle the memory modules under test.

More than one of the memory module slots on the PC motherboard may be loaded with an extender card, allowing two or more memory modules to be tested at the same time by the same PC motherboard. Each memory module socket or slot may have a different value of device-address lines A2, A1, A0, so each slot can be accessed separately. Other device-address lines could be intercepted. Intercepting decoder chip 30 could be an Application-Specific Integrated Circuit (ASIC), a programmable logic chip, a custom logic chip, or some other technology.

Other filtering circuits may be used to filter out the OS memory accesses in FIG. 5. For example, rather than relying on the test program performing more memory accesses than the OS, the filtering circuit may examine if the same memory location is repeatedly being accessed when the test program is written such that it loops on the same faulty memory address.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A decoding extender card comprising:
a substrate containing wiring traces for conducting signals;
first contact pads along a first edge of the substrate, the first contact pads for mating with a memory module socket on a motherboard;
a test socket, mounted to the substrate, for receiving a memory module during testing and programming;
wherein the wiring traces on the substrate include lines carrying address and control signals from the motherboard that are passed through to the test socket at pads for connecting to memory chips on the memory module;
data wiring traces on the substrate, the data wiring traces carrying data read from the memory module inserted into the test socket to the first contact pads so that the data read from the memory module inserted into the test socket is transferred to the motherboard;
wherein the memory module inserted into the test socket is removable and replaceable by another memory module for testing;
an intercepting decoder chip, mounted on the substrate, the intercepting decoder chip decoding a predefined function on the wiring traces, the predefined function being a function of the lines carrying address, data, and control signals from the motherboard; and
a filter in the intercepting decoder chip for activating a decoding indicator when a memory-test program accesses the memory module and for ignoring accesses of the memory module by an operating system and not activating the decoding indicator for operating system accesses, whereby operating system accesses are filtered out.

2. The decoding extender card of claim 1 further comprising: a scratch pad memory, coupled to the intercepting decoder chip, for storing an indication when the predefined function is decoded.

3. The decoding extender card of claim 2 wherein the scratch pad memory also stores the address signals from the wiring traces when the intercepting decoder chip decodes the predefined function.

4. The decoding extender card of claim 1 further comprising:
a visual indicator mounted to the substrate, the visual indicator being driven by the intercepting decoder chip when the intercepting decoder chip decodes the predefined function on the wiring traces and the filter activates the decoding indicator, wherein the visual indicator is visible to a user.

5. The decoding extender card of claim 4 wherein the visual indicator is a light-emitting diode (LED).

6. The decoding extender card of claim 5 wherein the visual indicator is mounted near a side edge of the substrate;
wherein the visual indicator is visible on the side edge of the decoding extender card when a stack of decoding extender cards are inserted into a group of memory module sockets on the motherboard.

7. The decoding extender card of claim 4 wherein the visual indicator is a liquid crystal display (LCD).

8. The decoding extender card of claim 7 wherein the intercepting decoder chip further comprises:
an address latch, coupled to lines carrying the address signals on the decoding extender card, for latching a latched address when the predefined function is decoded by the intercepting decoder chip.

9. The decoding extender card of claim 8 wherein the control signals further comprise a Row-Address-Strobe (RAS) and a Column-Address-Strobe (CAS);
wherein the intercepting decoder chip receives the RAS and the CAS;
wherein the address latch latches the address line when the RAS or the CAS is activated;
whereby row and column addresses are latched.

10. The decoding extender card of claim 9 wherein the latched address is driven to the visual indicator for display on the LCD.

11. The decoding extender card of claim 4 wherein the predefined function is an access of the memory chips on the memory module.

12. The decoding extender card of claim 11 wherein the wiring traces on the substrate include a chip-select line;
wherein the intercepting decoder chip receives the chip-select line;
wherein the predefined function is detected when the chip-select line is activated.

13. The decoding extender card of claim 12 wherein the wiring traces on the substrate include a write-enable line;
wherein the intercepting decoder chip receives the write-enable line;
wherein the predefined function is detected when the write-enable line is activated.

14. The decoding extender card of claim 13 wherein the predefined function is detected when the write-enable line and the chip-select line are both activated.

15. The decoding extender card of claim 1 wherein the intercepting decoder chip further comprises:
trigger logic that receives a chip-select line in the wiring traces and the address signals and generates a trigger signal when a physical address is decoded from the address signals and the chip-select line is activated;
a timer receiving a clock from the wiring traces and generating a reset signal after a period of time;
a counter that increments a count value when the trigger logic generates the trigger signal and resets the count value when the timer generates the reset signal;
decision logic that compares the count value to a threshold and generates an output signal when the count value exceeds the threshold;
wherein the output signal causes an indicator to be illuminated.

16. The decoding extender card of claim 15 wherein less frequent memory accesses caused by an operating system generate the count value that is less than the threshold;
wherein the counter and the decision logic filter operating system access to not generate the output signal and not illuminate the indicator;
wherein more frequent memory accesses caused by a test program cause the count value to exceed the threshold so that the output signal is generated and the indicator is illuminated,
whereby operating system accesses are filtered by the intercepting decoder chip to not illuminate the indicator.

17. The decoding extender card of claim 4 wherein the predefined function is an access of a physical memory location in the memory module that corresponds to a logical address being accessed repeatedly in a loop routine of a test program being executed by a process on the motherboard,
wherein the logical address activates the visual indicator to visually locate the physical address to a user.

18. The decoding extender card of claim 4 wherein the memory chips on the memory module are dynamic-random-access memory (DRAM) memory chips.

19. The decoding extender card of claim 18 wherein the substrate contains only the intercepting decoder chip and no other integrated circuit chips.

* * * * *